United States Patent
Luo (10) Patent No.: US 6,495,421 B2
(45) Date of Patent: Dec. 17, 2002

(54) MANUFACTURE OF SEMICONDUCTOR MATERIAL AND DEVICES USING THAT MATERIAL

(75) Inventor: JiKui Luo, Cardiff (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/738,921

(22) Filed: Dec. 14, 2000

(65) Prior Publication Data

US 2001/0006831 A1 Jul. 5, 2001

(30) Foreign Application Priority Data

Dec. 15, 1999 (GB) .............................................. 9929613

(51) Int. Cl.⁷ ............................................. H01L 21/336
(52) U.S. Cl. ........................ 438/269; 438/357; 438/358; 438/360; 438/415; 438/416; 438/607; 438/FOR 236; 438/FOR 237; 438/FOR 252
(58) Field of Search .......................... 438/156, 44, 269, 438/357, 358, 360, 607, 415, 416, FOR 236, FOR 237, FOR 252

(56) References Cited

U.S. PATENT DOCUMENTS

| | | | |
|---|---|---|---|
| 3,925,120 A | * 12/1975 | Saida et al. | 148/DIG. 145 |
| 4,671,851 A | * 6/1987 | Beyer et al. | 438/426 |
| 4,700,460 A | 10/1987 | Dolny et al. | 437/81 |
| 4,754,310 A | 6/1988 | Coe | 357/13 |
| 4,980,306 A | * 12/1990 | Shimbo | 438/222 |
| 5,008,208 A | * 4/1991 | Liu et al. | 438/361 |
| 5,436,190 A | * 7/1995 | Yang et al. | 438/224 |
| 5,438,215 A | 8/1995 | Tihanyi | 257/401 |
| 5,473,180 A | 12/1995 | Ludikhuize | 257/336 |
| 5,547,903 A | * 8/1996 | Hsu | 438/282 |
| 5,578,508 A | 11/1996 | Baba et al. | 437/35 |
| 5,700,712 A | * 12/1997 | Schwalke | 438/430 |
| 6,184,555 B1 | * 2/2001 | Tihanyl et al. | 257/329 |

FOREIGN PATENT DOCUMENTS

| | | | |
|---|---|---|---|
| EP | 0314465 A2 | 5/1989 | |
| JP | 05013566 A | * 1/1993 | ........... H01L/21/76 |
| WO | 9729518 A1 | 8/1997 | |

* cited by examiner

*Primary Examiner*—Sheila V. Clark
*Assistant Examiner*—Paul E Brock, II
(74) *Attorney, Agent, or Firm*—Steven R. Biren (57) ABSTRACT

A method is described of manufacturing a semiconductor material having a zone (200) with p-conductivity type and n-conductivity type regions with dopant concentrations and dimensions such that, when the n- and p-conductivity type regions are depleted of free charge carriers the space charge per unit area of the regions balances at least to the extent that the resulting electric field is lower than that at which avalanche breakdown would occur in the area. The method starts with a semiconductor body having adjacent a first major surface (10*b*) a first semiconductor region (2) of one conductivity type. A mask (3, 4, 5) is provided on the first major surface, having at least one mask area masking a part (2*a*) of the first region. At least a part of the unmasked first region (2) is then removed to provide at least one opening (7) in the first region. Doped epitaxial semiconductor material (8; 81, 82; 8*a*) is selectively provided in the opening (7) so as to fill the opening and to provide at least a second region (8; 81, 8*a*) of the opposite conductivity type. Then material (8; 82; 8*a*) is removed from the first major surface (10*b*) using at least a part (4) of the mask as an etch stop layer so as to provide a planar surface.

12 Claims, 6 Drawing Sheets

MANUFACTURE OF SEMICONDUCTOR MATERIAL AND DEVICES USING THAT MATERIAL

BACKGROUND OF THE INVENTION

This invention relates to a method of manufacturing a semiconductor material and to semiconductor devices manufactured using that material. In particular, this invention relates to a method of manufacturing a semiconductor material having an area or zone formed of first regions of one conductivity type interposed with second regions of the opposite conductivity type with the dopant concentration and dimensions of the first and second regions being such that, when the area is depleted in a high voltage mode of operation, the space charge per unit area in the first and second regions balances at least to the extent that the electric field resulting from the space charge is less than the critical field strength at which avalanche breakdown would occur in that area. The area thus provides a voltage-sustaining space charge zone when depleted.

Semiconductor devices having such zones are disclosed in U.S. Pat. No. 4,754,310 (our reference: PHB32740). As set out in U.S. Pat. No. 4,754,310, the provision of such a zone within a semiconductor device enables the individual dopant concentrations and thicknesses of the first and second regions to be controlled so that the effective dopant concentration of the area can be increased independently of the desired breakdown voltage so that the series resistivity of the area is approximately proportional to the breakdown voltage rather than to the square of the breakdown voltage as is the case in conventional devices. The achievement of a lower on-resistance device for a given breakdown voltage is particularly advantageous for high voltage MOSFETs and IGBTs. Other embodiments of semiconductor devices having such zones are disclosed in U.S. Pat. No. 5,438,215 and International Patent Publication No. WO-A-97/29518. The whole contents of U.S. Pat. Nos. 4,574,310, 5,438,215 and WO-A-97/29518 are hereby incorporated as reference material.

As described in U.S. Pat. Nos. 4,754,310, 5,438,215 and WO-A-97/29518, epitaxial refill of etched openings may be used to interpose regions of one conductivity type with regions of the opposite conductivity type where the semiconductor device is to be a vertical device, that is where the main current flow path is between first and second major opposed surfaces of the semiconductor device. Neither U.S. Pat. No. 4,754,310 nor U.S. Pat. No. 5,438,215 suggests how such epitaxial refill may be carried out. FIGS. 7A to 7B of WO-A-97/29518 suggest using repeated epitaxy with ion implantation of the opposite type dopant at each epitaxial stage. However, the number of steps involved in this process makes it expensive and, moreover, it is difficult to control the repeated epitaxy and ion implantation processes to achieve the required space charge balancing discussed above.

SUMMARY OF THE INVENTION

It is an aim of the present invention to provide a low-cost, straightforward process for manufacturing a semiconductor material having such an area.

According to one aspect of the present invention, a zone having p-conductivity type and n-conductivity type regions with dopant concentrations and dimensions such that, when the n and p-conductivity type regions are depleted of free charge carriers, the space charge per unit area of the regions balances at least to the extent that the resulting electric field is lower than that at which avalanche breakdown would occur in the area is manufactured by selective epitaxial deposition after which the semiconductor surface is planarised using as an etch stop a mask used to assist selective deposition.

According to another aspect of the present invention, a zone having p-conductivity type and n-conductivity type regions with dopant concentrations and dimensions such that, when the n and p-conductivity type regions are depleted of free charge carriers, the space charge per unit area of the regions balances at least to the extent that the resulting electric field is lower than that at which avalanche breakdown would occur in the area is manufactured by selective epitaxial deposition into at least one opening after which the semiconductor surface is planarised using as an etch stop a mask used to enable definition of the at least one opening.

According to further aspects of the present invention, there are provided a method as set out in claim 1 and a method as set out in claim 9.

Methods embodying the present invention provide a simple way for forming a voltage sustaining zone. A method embodying the present invention may be used to manufacture a high voltage MOS device, for example a MOSFET or IGBT, in which the zone forms at least part of the drain drift or drain extension region and requires only one more mask stage than is required for the manufacture of high voltage MOS devices which do not have such a zone.

Other advantageous technical features in accordance with the present invention are set out in the appended dependent claims.

Embodiments of the present invention will now be described, by way of example, with reference to the accompanying diagrammatic drawings, in which.

DESCRIPTION OF THE PREFERRED EMBODIMENTS

Figure 1:
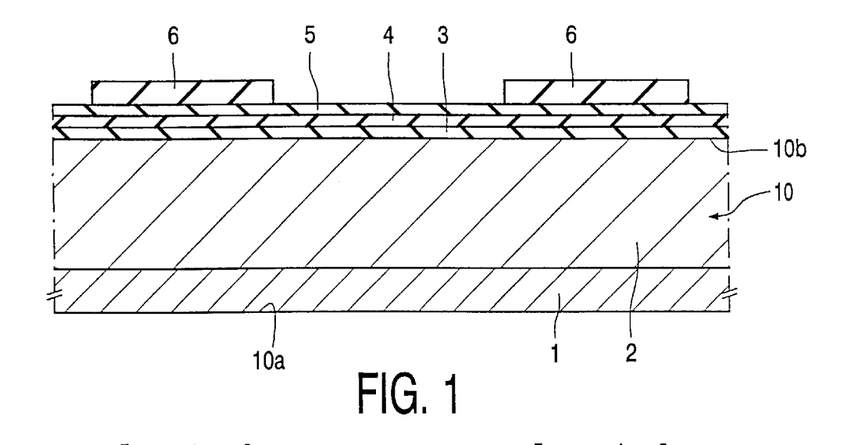
FIGS. 1 to 5 show cross-sectional views of part of a semiconductor body for illustrating various steps in a first embodiment of a process in accordance with the present invention for manufacturing a semiconductor material.

FIG. 1 shows a monocrystalline silicon semiconductor body 10 consisting of a relatively highly doped substrate 1 of one conductivity type (n+conductivity type in this example) on which is provided a relatively lowly doped epitaxial layer 2 of the same conductivity type (n−conductivity type in this example).

A thermal oxide layer 3 having a thickness of, typically, between 30 and 50 nanometres is grown on a surface 10$b$ of the semiconductor body 10. A silicon nitride layer 4 is then deposited on the thermal oxide layer 3 using low pressure chemical vapour deposition (LPCVD) to provide a layer thickness of 100–150 nanometres. A silicon oxide layer 5 having a thickness of 100–200 nanometres is then provided on the silicon nitride layer 4 by chemical vapour deposition (CVD). Conventional photolithographic and etching techniques are used to define a dry etching mask 6 on top of the oxide layer 5.

Figure 2:
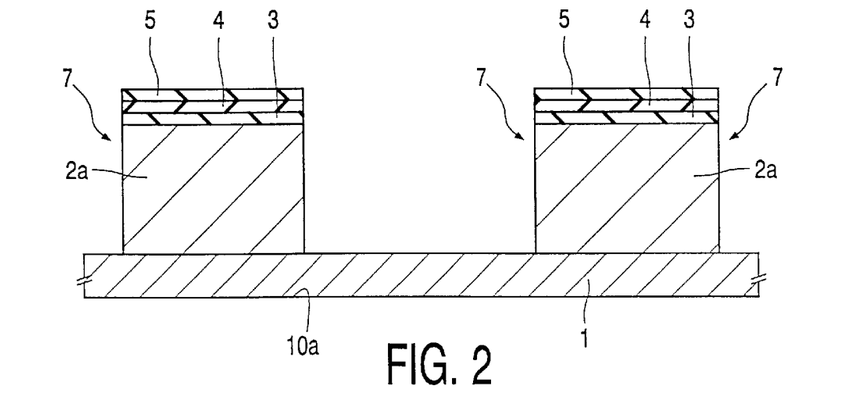

A conventional silicon anisotropic etching process, for example a dry plasma etch using $SF_6$ and $O_2$ and optionally also $CHF_3$ is then used to etch openings 7 extending, in this example, completely through the epitaxial layer 2 to the substrate 1 so as to leave regions 2$a$ of the epitaxial layer. The mask 6 is then removed to produce the structure shown in FIG. 2 and the etched surface is then cleaned. The cleaning may be carried out by thermally growing a thin sacrificial oxide layer to eliminate polymers formed as a result of the anisotropic etch and then removing the sacrificial oxide layer using a wet etch process such as a BHF solution. Other cleaning processes are described in "VLSI Technology", Second edition, by S. M. Sze published in 1988 (ISBN 0-07-100347-9) at paragraph 1.5.1 at pages 44 and 45.

Figure 3:
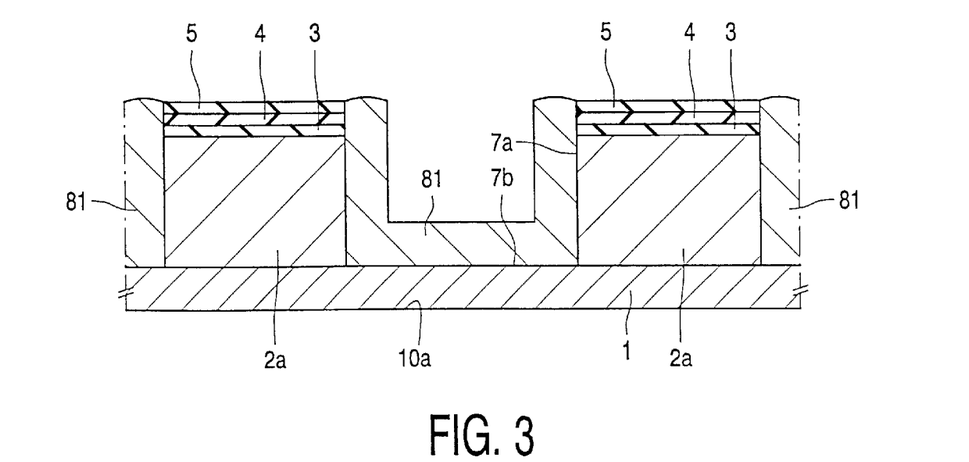

Once the etched surfaces have been cleaned, silicon of the opposite conductivity type, p-conductivity type in this example, is selectively epitaxially grown in the openings 7 as shown in FIG. 3. As another possibility the cleaning may be carried out using HCl at the beginning of the selective epitaxy.

In this example, selective epitaxial deposition is achieved by a chemical vapour deposition process which provides silicon atoms with high surface mobility so that the silicon atoms migrate to sites on the exposed single crystal silicon where nucleation is favoured. Silicon mobility, and hence selective deposition on silicon, is enhanced by the presence of halides with, where the halide is chlorine, the selectivity increasing with the number of chlorine atoms. A good silicon source is $SiHCl_3$ because it has a high chlorine content but requires a lower deposition temperature than $SiCl_4$. $SiH_2Cl_2$ and $SiH_4$ (silane) may also be used if hydrogen chloride or chlorine is added to the deposition gases, although this may result in a lower deposition rate. Other silicon halides such as $SiHBr_3$ and $SiBr_4$ may also be used.

In this example, doping (using boron ions) is carried out during deposition to enable good control over the dopant concentration.

The p-conductivity type epitaxial material is selectively deposited to form a layer 81 having a thickness in the range of 0.5 to 5 micrometres on the side walls 7$a$ of the openings 7. The dopant concentration of the layer 81 is typically in the range $1 \times 10^{15} cm^{-3}$ to $1 \times 10^{16} cm^{-3}$. As shown in FIG. 3, the p-conductivity type layer 81 grows on both the side walls 7$a$ and also forms bottom portions 81$a$ on the bottoms 7$b$ of the openings 7.

After selective epitaxial deposition has been carried out for the required time to produce the above-mentioned thickness for the layer 81, the dopant is changed to an n-conductivity type dopant, typically phosphorus and selective deposition continues so that n-conductivity material is grown on the selectively deposited p-conductivity type epitaxial layer 81. Typically, the dopant concentration is in the region of $1 \times 10^{15} cm^{-3}$. Epitaxial growth of the n-conductivity type material is continued until n-conductivity type regions 82 which extend up over the edge of the openings 7 onto the oxide layer 5 are provided. The reason for continuing the growth to this extent is that the deposition tends to occur faster adjacent the walls 7$a$ of the openings 7 and so there may be a dip in the centre of the epitaxial region 82. Continuing the epitaxial deposition until the region 82 grows over onto the edge of the oxide layer 5 ensures that the level of the epitaxial region 82 at the centre of the opening 7 will not be lower than the bottom of the layer 3.

Figure 4:
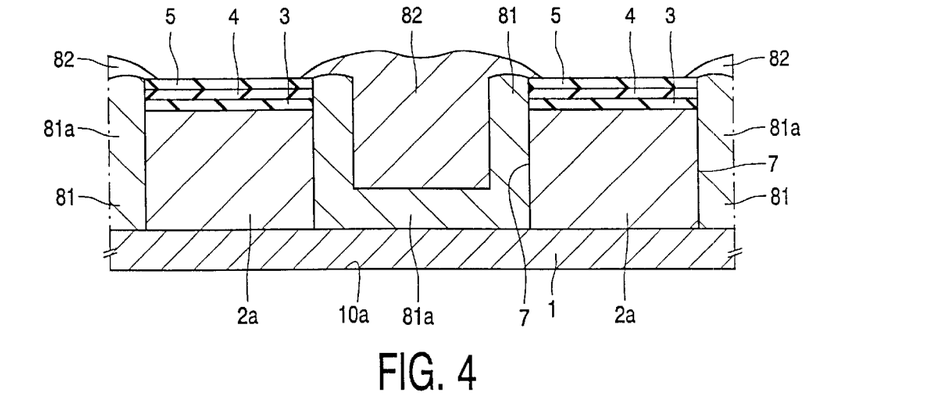

Once the selective deposition has been completed as shown in FIG. 4, a conventional chemical mechanical polishing is carried out. As described in section 1.4.3 at pages 41 and 42 of the aforementioned book entitled "VLSI Technology" by S. M. Sze, the polishing may be carried out in a polishing machine which uses a polishing slurry consisting of a colloidal suspension of fine (10 nanometre diameter) silicon dioxide particles in an aqueous solution of sodium hydroxide. The polishing process is stopped at the silicon nitride layer 4 which acts as an etch stop layer. A slight overpolish may be effected to ensure a planar surface.

The silicon nitride layer 4 and underlying oxide layer 3 are then removed using known selective etching processes which etch silicon nitride and silicon oxide selectively with respect to silicon. Typically, the silicon nitride layer is selectively removed using a $CF_4 + O_2$ plasma etch while the silicon oxide is selectively removed using buffered HF.

Figure 5:
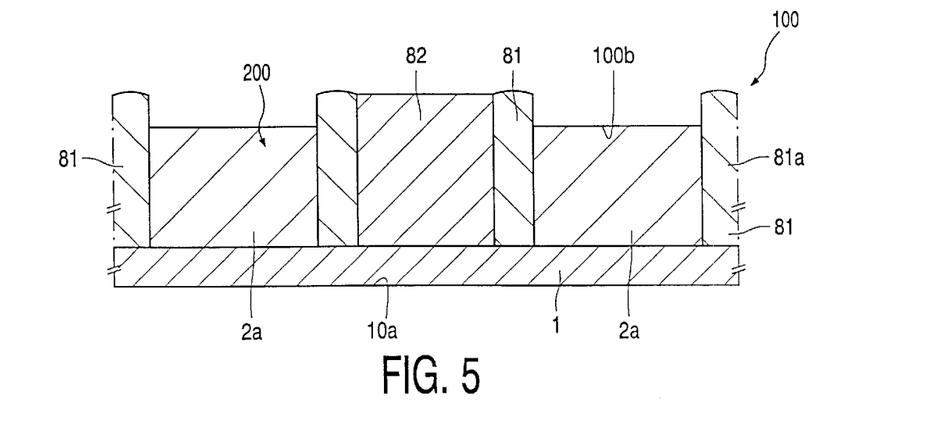

FIG. 5 shows the resulting semiconductor material 100. Although FIG. 5 shows a step in the surface 100$b$ between the regions 81 and 82 and the regions 2$a$, in practice this step can be well controlled to be under 100 nanometres which, for the purposes of high voltage power MOS devices, can be considered to constitute a planar surface.

As can be seen from FIG. 5, at this stage the bottom portions 81$a$ of the p-conductivity type regions 81 have disappeared so that the n-conductivity type regions 82 extend to the n+substrate 1. The reason for this is the diffusion of dopant out of the highly doped substrate 1 during the relatively high temperature selective deposition of the regions 82. If necessary, a short thermal anneal may be carried out to ensure this out-diffusion of dopants so that the regions 82 contact the n-conductivity type substrate 1 to provide an n-conductivity type path between the major surfaces 10$a$ and 10$b$ of the semiconductor material. Subsequent heat treatments such as growth of the gate oxide will also contribute to the out-diffusion process.

The dimensions and dopant concentrations of the epitaxial regions 2$a$, 81 and 82 of the zone 200 shown in FIG. 5 are selected such that, under high voltage operation, the zone 200 formed by these regions can be depleted of free charge carriers in such a manner that the space charge per unit area balances out at least to the extent that the electric field resulting from the space charge is less than the critical field strength at which avalanche breakdown would occur in the area defined by the regions 2a, 81 and 82. The use of the polishing process described above enables, after removal of the layers 4 and 5, the original silicon surface 10b (with the very small step discussed above with reference to FIG. 5) to be re-established so allowing good control over and determination of the depth of the charge-balanced zone 200 by the depth to which the openings 7 were etched and/or the thickness of the epitaxial layer 2.

Figure 6:
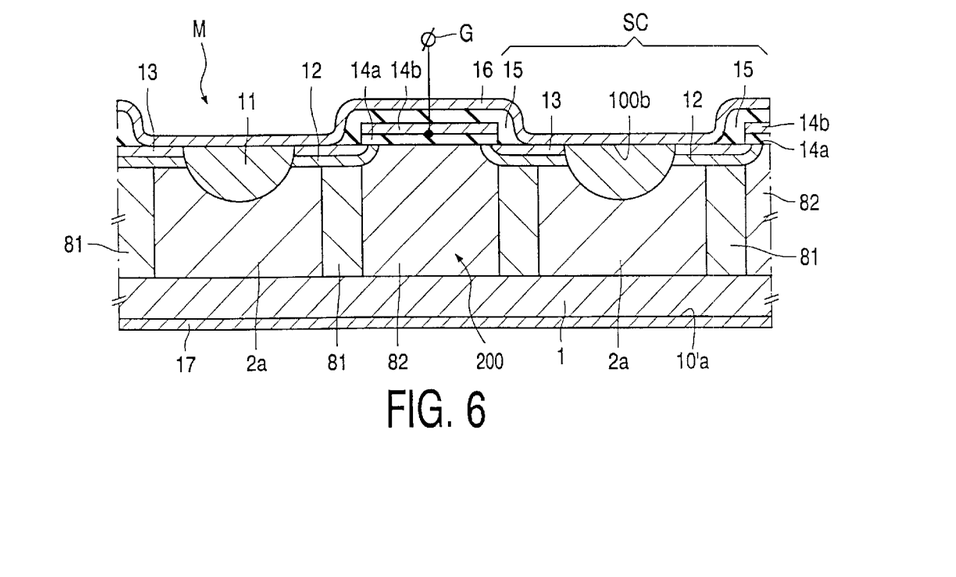
FIG. 6 shows a cross-sectional view of part of a vertical high voltage MOS device manufactured using the semiconductor material shown in FIG. 5.

The semiconductor zone 200 formed by the regions 2a, 81 and 82 may be used to form the drain drift or drain extension region of a vertical power MOS device. FIG. 6 shows a cross-sectional view through part of a vertical power MOS device M formed using the material 100 shown in FIG. 5. This device is formed using conventional DMOS fabrication techniques. Thus, initially a gate oxide 14a is grown on the surface 100b followed by a doped polycrystalline silicon gate layer 14b. These layers are patterned using conventional photolithographic techniques to define a gate structure G which, in this example, extends over the surface area in which the openings 7 were formed so that the gate structure G extends entirely over the epitaxially deposited regions 82 but only partially over the regions 81 as shown in FIG. 6. It will thus be appreciated that, in this example, the openings 7 and the gate structure G will have the same geometry when viewed in plan, that is when looking down on the surface 10b of the semiconductor body 10. Generally, the openings 7 form a single continuous trench and the gate structure G defines a mesh or grid-like structure.

A source cell SC is formed, in known manner, in each opening in the grid-like structure of the gate G. Thus, opposite conductivity type impurities are implanted using the gate structure G as a mask. After a thermal process to drive in the implanted dopants to form body regions 12 as shown in FIG. 6, impurities of the one conductivity type, n-conductivity type in this example, are implanted again using the gate G as a mask and driven in to define source regions 13 as in the conventional double diffused DMOS process so that the length of a channel accommodating region in each body region under the gate structure G is defined by the double diffusion process. A relatively highly doped region 11 of the opposite conductivity type is formed in the centre of each source cell SC. These regions 11 may, as shown in FIG. 6, be relatively deep regions to control, in known manner, the breakdown voltage behaviour of the MOS device or may be relatively shallow regions provided simply to enable good ohmic contact to the body regions 12. Where the regions 11 are relatively deep regions then they may be formed either before or after the body regions 12. Generally, where the regions 11 are shallow regions simply provided to enable good ohmic contact to the body regions 12 then they will be formed after the source regions 13. The regions 11 may overdope the source regions 13 or the central region 11 of each source cell SC may be masked during the introduction of the impurities to form the source regions 13.

An oxide layer (generally TEOS) is then deposited over the gate structure G and etched using known photolithographic techniques to define contact windows over each source cell SC and also, although not shown in FIG. 6, a contact window for enabling metallisation to contact the gate structure G. Metallisation, typically aluminium, is then deposited and patterned using known photolithographic techniques to define source metallisation 16 which, in each source cell SC, electrically shorts the source region 13 to the corresponding region 11 to inhibit parasitic bipolar action.

Although not shown in FIG. 6, a passivating layer is generally provided over the metallisation 16 and a final photolithographic step carried out to form contact windows in the passivating layer to enable connection of electrodes to the source metallisation 16 and the gate structure G. The substrate 1 is then thinned to the required thickness, typically 200–250 micrometres and drain metallisation 17 deposited onto the rear surface 10'a.

It will be appreciated that FIG. 6 shows only part of the active area of the high voltage or power MOS device and that, in practice, the high voltage or power MOS device will consist of many thousands of parallel-connected source cells SC sharing a common drain region 1.

As is conventional in the art, the power MOS device will also generally be provided with edge termination or field relief in the form of diffused regions such as Kao's rings or the like and/or field plates surrounding the active area containing the source cells.

As shown in FIG. 6, the epitaxial regions 82 together form the drain drift or extension region of the vertical power MOS device M. These regions 82 are relatively highly doped and therefore provide a relatively low resistivity current path and thus a low on-resistance for the MOS device. However, at the same time, the dopant concentration and dimensions of the regions 2a, 81 and 82 are such that when a reverse biassing voltage is applied between the source and drain electrodes with no gate voltage applied, that is when the MOS device M is non-conducting, the regions 2a, 81 and 82 are depleted of free charge carriers in a manner that space charge balancing between the regions 2a, 81 and 82 occurs as discussed in U.S. Pat. No. 4,754,310 such that the electric field resulting from the overall space charge is less than the critical electric field at which avalanche breakdown would occur in the zone 200. Thus, a low on-resistance power MOS device is provided which is capable of withstanding high reverse voltages.

A second embodiment of a process in accordance with the present invention will now be described with reference to FIGS. 7 to 10.

Figures 7, 8:
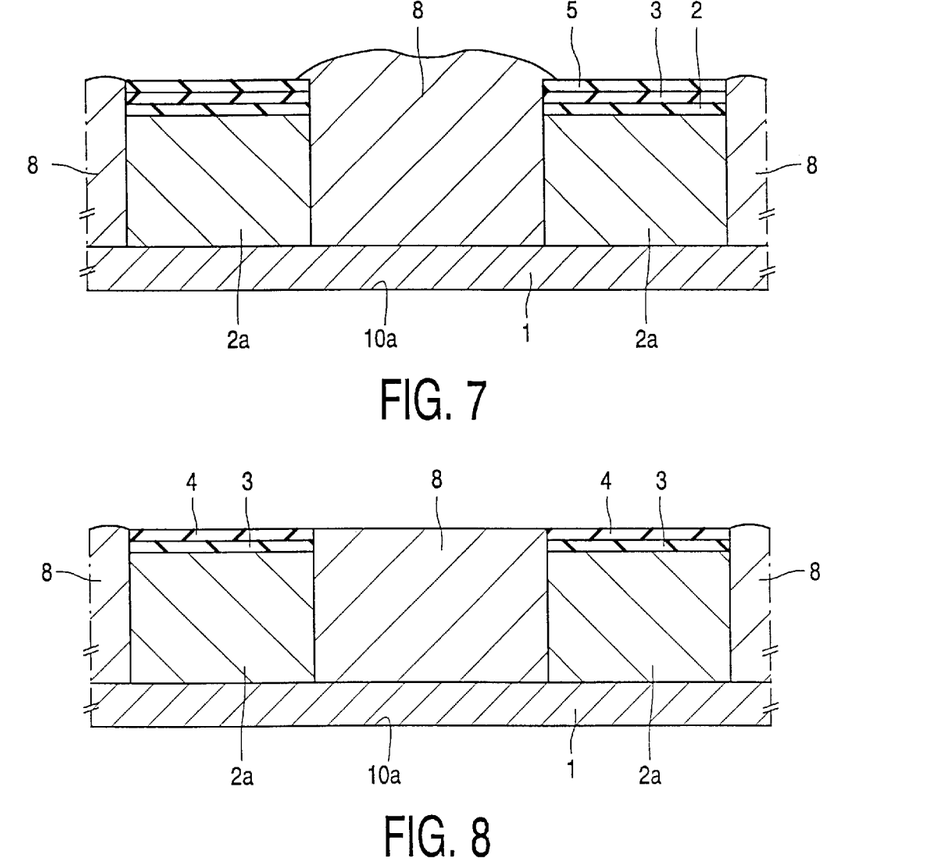
FIGS. 7 to 9 show cross-sectional views of part of a semiconductor body to illustrate steps replacing those shown in FIGS. 3 to 5 in a second embodiment of a process in accordance with the present invention for manufacturing a semiconductor material.

In this embodiment, the epitaxial layer 2 is of the opposite conductivity type, p conductivity type in this example, to the substrate 1. Openings 7 are etched into the epitaxial layer 2 as described above with reference to FIG. 2. Selective deposition of material of the one conductivity type, n conductivity type in this example, into the openings 7 is then commenced as described above with reference to FIG. 3. However, in this embodiment, the selective deposition is continued until the openings 7 are completely filled and the one conductivity type material 8 steps up onto the surface of the oxide layer 5 as shown in FIG. 7. A chemical mechanical polishing is then carried out as described above with reference to FIG. 4 stopping at the silicon nitride layer 4 so as to produce the structure shown in FIG. 8. The silicon nitride layer 4 and oxide layer 3 are then selectively removed as described above with reference to FIGS. 4 and 5 to result in the semiconductor material 201 shown in FIG. 9. Again, as explained above with reference to FIG. 5, the step in the surface 100b can be well controlled to be under 100 nanometres.

Figure 10:
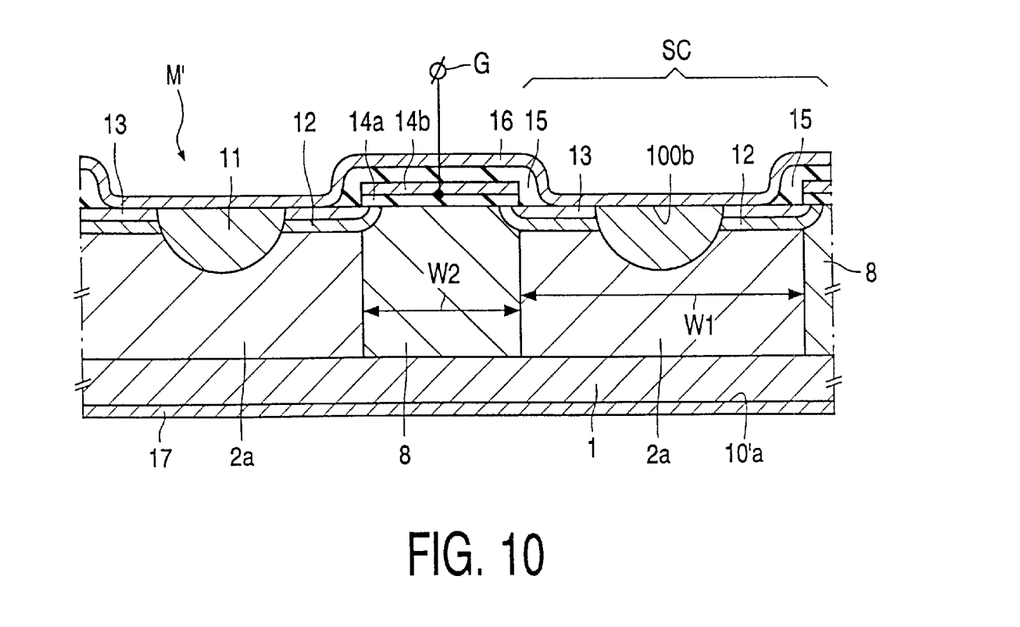
FIG. 10 shows a cross-sectional view through part of a high voltage MOS device manufactured using the semiconductor material shown in FIG. 9.

Conventional DMOS fabrication techniques may then carried out in a manner similar to that described above with reference to FIG. 6 so as to produce the MOS device M' structure shown in FIG. 10. It will be appreciated that the MOS device structure shown in FIG. 10 differs from that shown in FIG. 6 in that only one conductivity type of material is selectively deposited into the openings 7.

In the above-described embodiments, the regions 8 or 82 rather than the regions 2a are selectively deposited. This has the advantage that the relatively more highly doped regions 8 or 82 are formed after the more lowly doped regions 2a and so the possibility of undesired diffusion of dopants should be reduced. Where this is not a problem, then the regions 2a rather than the regions 82 may be selectively epitaxially deposited so that the gate structure G is formed over the remaining portions 2a of the epitaxial layer 2 rather than over the selectively deposited regions 8. This would, of course, mean that where the gate G has a mesh-like structure then the etched openings 7 will be in the form of discrete individual openings rather than, as in the case for FIG. 6, in the form of a trench defining a mesh or grid.

In the MOS devices shown in FIGS. 6 and 10, the one conductivity type epitaxial regions 82 extend beneath the majority of the gate electrode structure and the body regions 12 abut or slightly overdope the regions 82 so as to maximise the extent of the drain drift region and thus provide a good conductive path to the drain region in the on state.

Figure 9:
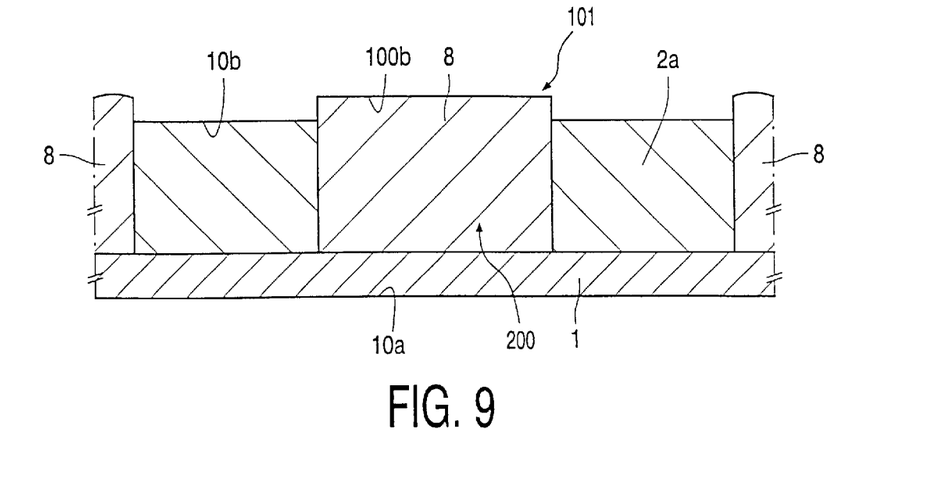

As another possibility, where the method described with reference to FIGS. 7 to 9 is used, the vertical MOS device may be formed without the need for the body regions 12. In this case a threshold adjustment implant of opposite type impurities (p type in this example) is first of all carried out to bring the dopant concentration at the surface of the opposite conductivity type regions 2a up to the concentration required for the channel accommodating portion. After the threshold adjustment implantation, the gate oxide layer 14a and polycrystalline silicon gate conductive layer 14b are deposited and defined as described above to form the gate structure centred over the selectively epitaxially deposited regions 8 so that the gate structure G overlaps onto the adjoining opposite conductivity type regions 2a. Impurities of the one conductivity type are then introduced using the gate structure as a mask and driven in to form the source regions 13 so that each channel accommodating portion is defined between the source region and the closest edge 8' of the adjacent selectively deposited epitaxial region 8. The remaining steps in the formation of the MOS device are the same as those described above with reference to FIG. 6. It will, however, be appreciated by those skilled in the art that this MOS device structure requires very precise control of the threshold implantation and very precise alignment of the gate structure G with the selectively epitaxially deposited regions 8 to ensure precise control of the conduction channel length and to avoid punch-through problems.

In each of the above-described embodiments, the MOS device is a MOSFET and generally the one conductivity type will be n-conductivity type so that the MOSFET is an n-channel MOSFET. It will, however, be appreciated that the conductivity types could be reversed so that the MOSFET is a p-channel MOSFET. Also, with the use of an appropriate threshold adjusting implant the MOSFET could be a normally on (depletion mode) rather than a normally off (enhancement mode) MOSFET. The present invention enables the on-resistance to be reduced without adversely affecting the breakdown voltage and is particularly advantageous in majority carrier devices such as MOSFETs where there is no possibility of the use of conductivity modulation by minority carriers to reduce the on-resistance. However, the present invention may also be applied to MOS devices such as insulated gate bipolar transistors (IGBTs) which employ conductivity modulation if the substrate 1 is formed so as to be of opposite conductivity type to the drain drift region.

Figure 11:
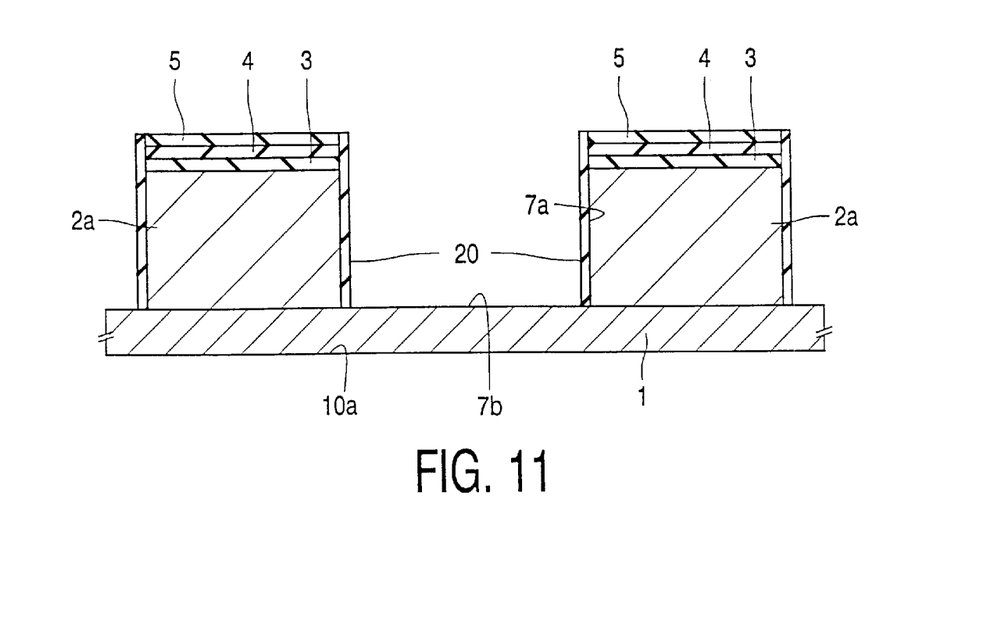
FIG. 11 shows a cross-sectional view through part of a semiconductor body to illustrate a further modification of the method described above with reference to FIGS. 1 to 5 or FIGS. 1, 2 and 7 to 9.

FIG. 11 shows a cross-sectional view at a stage similar to that shown in FIG. 2 to illustrate a modification that may be applied to the method described above with reference to FIGS. 1 to 6 or FIGS. 7 to 10. In this modification, after etching and cleaning of the openings 7, a thin dielectric layer 20 is formed on the side walls 7a of the openings 7. This may be achieved by, for example, growing a thin thermal oxide on the surface structure and then carrying out an anisotropic etch to remove the oxide from the bottom surfaces 7b of the openings 7. This dielectric layer 20 serves to provide isolation between the regions 2a and the material later selectively deposited into the opening 7 so as to reduce the possibility of diffusion of dopants between the two regions. The provision of such relatively thin dielectric layers is allowable because the current flow path is parallel to not across these dielectric layers. Provided that the dielectric layer is much thinner than the width of the opposite conductivity type regions, then it will not affect the breakdown voltage nor the on-resistance of the device.

Figure 12:
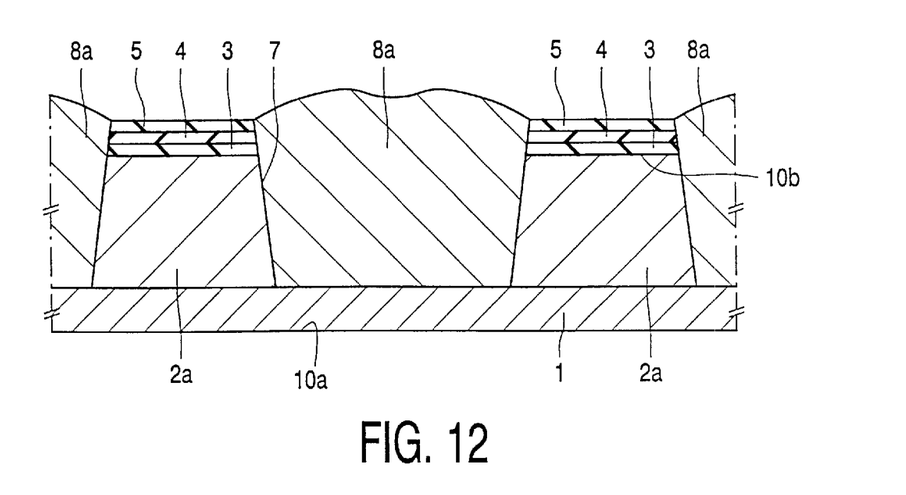
FIG. 12 shows a cross-sectional view through a semiconductor body to illustrate another modification that may be applied to the methods shown in FIGS. 1 to 5 or FIGS. 1, 2 and 7 to 9.
Figure 13:
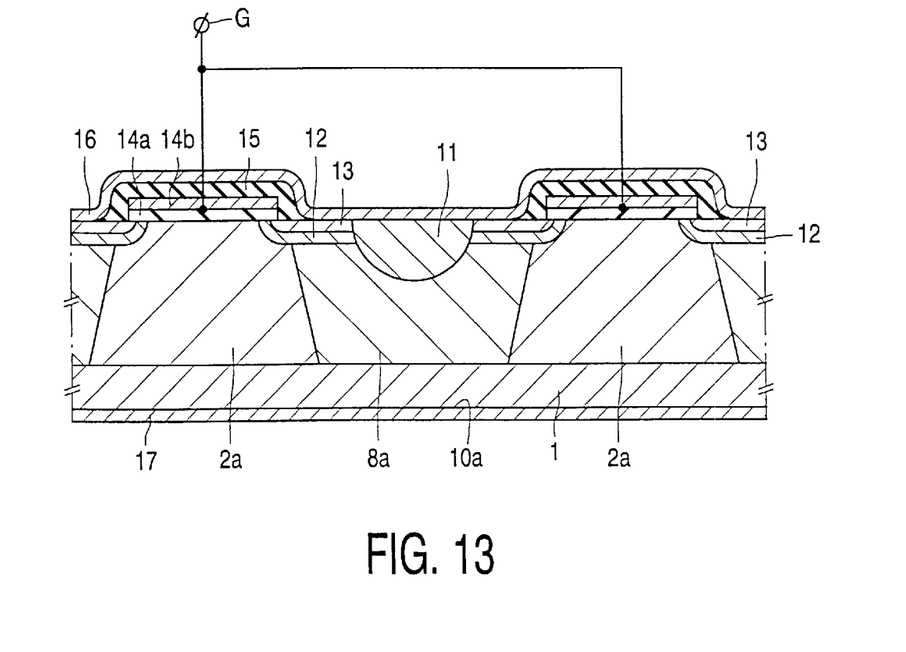
FIG. 13 shows a cross-sectional view through part of a high voltage MOS device manufactured using the semiconductor material shown in FIG. 12.

FIG. 12 shows a view comparable to FIG. 7 to illustrate a further modification. In this example, the epitaxial layer 2 is of the same conductivity type as the substrate 1 and etching of the openings 7 is carried out using a less than completely anisotropic etching process which results in the openings 7 and thus the subsequent selectively deposited epitaxial regions 8a widening away from the substrate 1. In this example, as shown in FIG. 13, the MOS device is formed so that the insulated gate G is provided over the remaining regions 2a of the epitaxial layer 2 so that the drain drift region widens towards the substrate or drain region 1 enabling a more even spread of the electric field and so enabling an even higher reverse breakdown voltage. A similar effect may be achieved by, for example, in the arrangements shown in FIG. 6 or 10, controlling the amount of dopant impurities introduced to form the selectively deposited epitaxial region 82 or 8 so that the dopant concentration decreases away from the drain region.

In each of the methods described above, after the selected deposition, the surface is planarised by using a chemical-mechanical polishing which is stopped at the etch stop layer 4. In the embodiments described above, the etch stop layer 4 is a silicon nitride layer. However, any other material that enables selective removal by polishing of silicon and oxide may be used. In addition, other planarising techniques may be used in place of the chemical-mechanical polishing. For example, after the selective deposition, the surface structure may be planarised by applying a spin-on glass or other flowable composition to obtain a planar surface and etching the entire surface using an etching process which etches the spin-on layer, monocrystalline silicon and silicon dioxide at the same rate. Again, the end point of the etching is defined by an etch stop layer such as the layer of silicon nitride mentioned above. This end point can be detected by detecting the first occurrence of material present in the etch stop layer but not in the other material in the matter etched from the surface.

Figure 14:
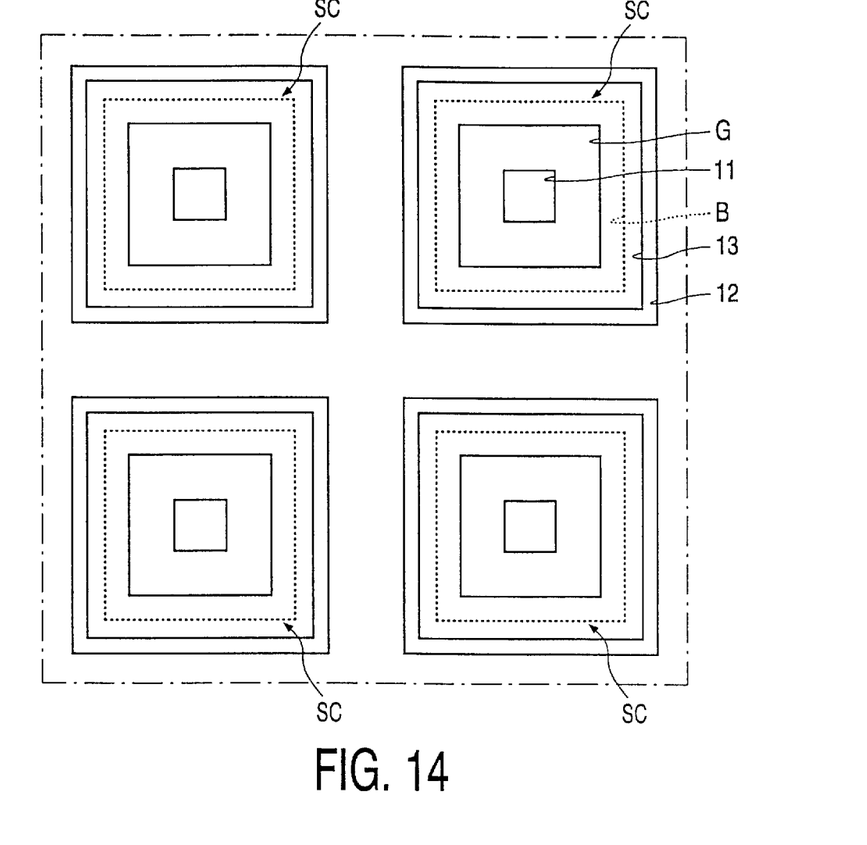
FIG. 14 shows a top-plan view of part of a high voltage MOS device manufactured using a method in accordance with the present invention with surface layers subsequent to the gate being omitted in the interests of clarity.

The MOS devices described above may have any known geometric layout. For example, the MOS devices may have a stripe geometry with a plurality of elongate gate structures arranged parallel to one another. Alternatively the gate structure may have a mesh- or grid-like arrangement which may have a square or hexagonal configuration so that the source cells form a close packed array of square or hexagonal source cells. FIG. 14 shows a top plan view (with a source metallisation removed) of four source cells SC of the MOS device shown in FIG. 10 to illustrate such a square configuration. As can be seen from FIG. 14, the boundary B between the epitaxial regions 2a and 8 lies between that of the gate structure G and the corresponding source region 13.

It will, however, be appreciated that this boundary B need not necessarily be at this point and that the only restriction on the location of this boundary is that there is a sufficient conductive path for majority carriers leaving the conduction channel region to the drain region.

Figure 15:
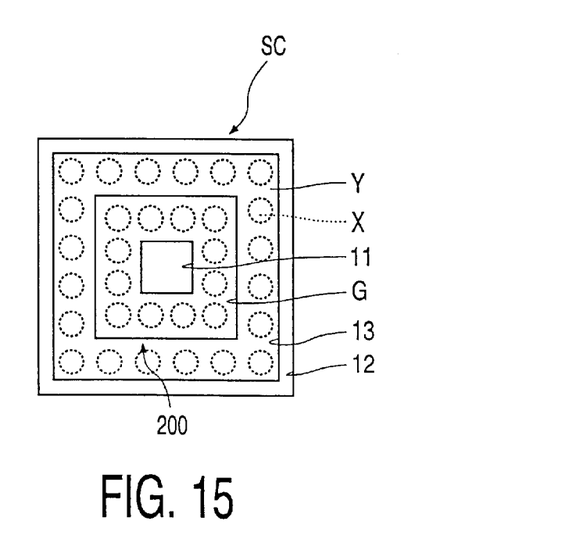
FIG. 15 shows a top-plan view, with the surface layers over the gate omitted, of a source cell of a high voltage MOS device to illustrate a modification of the layout shown in FIG. 14.

In the embodiments described above the opposite conductivity type first and second regions have dimensions commensurate with the size of the source cells. Thus, for example, in the embodiment shown in FIG. 10 the width W1 of the regions 2a is comparable to the width of the source cells SC while the width W2 of the regions 8 is comparable (somewhat smaller than) the width of the gate structure G. It will be appreciated, however, that this need not be the case and that the openings 7 formed in the epitaxial layer 2 may be very much smaller than the size of the source cells SC and the gate array G so that, for example, as shown schematically by the top plan view shown in FIG. 15, the voltage sustaining zone 200 has a plurality of columnar type regions X of one conductivity type formed by selectife deposition in a region Y of the other conductivity type.

Also, the voltage sustaining zone 200 need not extend through the entirety of the drain drift region provided that the conductive path to the drain region 1 is assured. For example, the openings 7 need not extend entirely through the epitaxial layer 2 and/or a further epitaxial layer may be deposited over the entirety of the zone 200 after the silicon nitride and oxide layers 4 and 3 have been removed following the selective deposition.

The interposed different conductivity regions may have any shape and distribution that can be achieved by the above-described etching and selected deposition process provided that the dopant concentrations and thicknesses in the voltage sustaining direction of those regions are such that when the area is depleted under high reverse voltage, the space charge per unit area balances out at least to such an extent that the overall electric field is less than the critical field that would result in avalanche breakdown of the area, and provided that there exists a conductive path for majority carriers from the channel accommodating portion to the drain region.

In the above-described MOS devices, the gate structure G is formed on the surface 100b. However the present invention may be applied to so-called TRENCH devices where the gate structure is formed in a trench extending into the surface 100b.

The present invention may also be applied to lateral devices such as disclosed in, for example, U.S. Pat. No. 5,473,180. The present invention may also be applied to other majority carrier semiconductor devices requiring a voltage sustaining area, for example high voltage Schottky diodes.

In most devices in accordance with the present invention, the region 2 (in which openings 7 are etched and then filled with the selectively provided epitaxial material) will be an epitaxial semiconductor region. However, the region 2 in some devices may be bulk semiconductor material, for example a region of a homogeneously doped monocrystalline wafer. The homogeneous doping concentration of the wafer can be determined precisely by, for example, neutron transmutation doping in known manner. This original homogeneous doping of the wafer can be kept for the region 2 that adjoins one major surface 10b of the wafer, while additional dopant of either conductivity type may be implanted and/or diffused at the opposite major surface to form a highly doped region 1.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although claims have been formulated in this application to particular combinations of features, it should be understood that the scope of the disclosure of the present invention also includes any novel feature or any novel combination of featured disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to any such features and/or combinations of such features during the prosecution of the present application or of any further application derived therefrom.

What is claimed is:

1. A method for manufacturing a semiconductor material with a zone having p-conductivity type and n-conductivity type regions with dopant concentrations and dimensions such that, when the n and p-conductivity type regions are depleted of free charge carriers the space charge per unit area of the regions balances at least to the extent that the resulting electric field is lower than that at which avalanche breakdown would occur in the area, the method comprising the steps of:

(a) providing a semiconductor body having first and second opposed major surfaces and having adjacent the first major surface a first semiconductor region of one conductivity type;

(b) providing on the first major surface a mask having at least one mask area masking a part of the first region;

(c) removing at least a part of the unmasked first region to provide at least one opening in the first region;

(d) selectively depositing a first layer of doped epitaxial semiconductor material of the opposite conductivity type on the walls of the at least one opening so as to fill the at least one opening and to provide at least a second region of the opposite conductivity type;

(e) selectively depositing epitaxial semiconductor material of the one conductivity type into the at least one opening so as to fill the opening; and (f) removing material from the first major surface using at least a part of the mask as an etch stop layer so as to provide a planar surface so that the at least one opening contains regions of the opposite conductivity type separated by a region of the one conductivity type.

2. A method according to claim 1, which comprises carrying out step (f) by using a chemical-mechanical polishing process or by applying a planarising layer and then using an etching process which etches the planarising layer at substantially the same rate as the epitaxial semiconductor material.

3. A method according to claim 1, which comprises providing a dielectric layer on side walls of the at least one opening before carrying out step (d).

4. A method according to claim 1, which comprises providing as at least a part of the mask a silicon nitride layer to provide the etch stop.

5. A method according to claim 4, which comprises providing the mask as alternate layers of silicon oxide and silicon nitride.

6. A method according to claim 1, which comprises carrying out step (c) so that the at least one opening flares outwardly towards the first major surface.

7. A method of manufacturing a high voltage MOS device, which comprises providing a semiconductor body having a zone manufactured using a method in accordance with any one of the preceding claims, providing the semiconductor body with source and drain regions and an insulated gate structure for controlling a conduction channel accommodating region extending between the source region and the zone whereby regions in the zone of the same conductivity type provide a conductive path from the channel accommodating region to the drain region.

8. A method according to claim 7, which comprises carrying out steps (b) and (c) so that the at least one opening defines a trench and providing the insulated gate structure so as to define the channel accommodating region in epitaxial material provided in the trench.

9. A method according to claim 7, which comprises carrying out steps (b) and (c) so that the at least one opening defines a trench and providing the insulated gate structure so as to define the channel accommodating region in the first region.

10. A method according to claim 7, which comprises providing the source and drain regions at opposite ones of the first and second major surfaces.

11. A method according to claim 1, wherein the first semiconductor region is provided in step (a) as an epitaxial layer of the one conductivity type on a highly doped substrate of the one conductivity type, and the opening is etched in step (b) completely through the epitaxial layer of the one conductivity type to contact the substrate at a bottom of the opening.

12. A method according to claim 11, wherein the first layer of epitaxial semiconductor material of the opposite conductivity type is deposited in step (d) on the walls of the opening and on the highly doped substrate at the bottom of the opening, and wherein dopant of the one conductivity type diffuses from the highly doped substrate during step (d) to overdope the opposite conductivity type dopant of the first layer at the bottom of the opening.

* * * * *